(12) United States Patent
Lin et al.

(10) Patent No.: US 8,563,853 B2
(45) Date of Patent: *Oct. 22, 2013

(54) SOLAR CELL DEVICE

(75) Inventors: Chin-Ching Lin, Taichung (TW);
Mei-Ching Chiang, Taipei County (TW); Hsiang-Chuan Chen, Taoyuan County (TW); Jen-You Chu, Changhua County (TW); Yi-Ping Chen, Kaohsiung County (TW); Pei-Chen Chuang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 194 days.

This patent is subject to a terminal disclaimer.

(21) Appl. No.: 12/908,701

(22) Filed: Oct. 20, 2010

(65) Prior Publication Data

US 2011/0088778 A1   Apr. 21, 2011

Related U.S. Application Data

(63) Continuation-in-part of application No. 12/754,544, filed on Apr. 5, 2010.

(30) Foreign Application Priority Data

Oct. 20, 2009 (TW) ................. 98135353 A
Oct. 15, 2010 (TW) ................. 99135177 A

(51) Int. Cl.
*H01L 31/00* (2006.01)

(52) U.S. Cl.
USPC ........... 136/256; 136/252; 136/255; 136/257; 136/261

(58) Field of Classification Search
USPC ........ 136/244, 250, 251, 252, 256, 257, 259, 136/261, 255
See application file for complete search history.

(56) References Cited

U.S. PATENT DOCUMENTS

| 4,663,495 A * | 5/1987 | Berman et al. ................ 136/248 |
| 5,998,730 A | 12/1999 | Shiozaki et al. |
| 6,268,059 B1 | 7/2001 | Cronin et al. |
| 6,656,523 B2 | 12/2003 | Russo et al. |
| 2006/0090790 A1* | 5/2006 | Kobayashi et al. ........... 136/256 |
| 2007/0074757 A1* | 4/2007 | Mellott et al. ................ 136/256 |
| 2009/0162697 A1* | 6/2009 | Cheng et al. .................. 428/702 |
| 2010/0288348 A1 | 11/2010 | Lin et al. |
| 2011/0088761 A1* | 4/2011 | Lin et al. ....................... 136/255 |
| 2011/0088778 A1 | 4/2011 | Lin et al. |

OTHER PUBLICATIONS

US Patent Office, Office Action, U.S. Appl. No. 12/754,544, Jun. 19, 2012, US.

* cited by examiner

Primary Examiner — Jonathan Johnson
Assistant Examiner — Lindsey Bernier

(57) ABSTRACT

A solar cell device is provided, including a transparent substrate, a transparent conductive layer disposed over the transparent substrate, a photovoltaic element formed over the composite transparent conductive layer, and an electrode layer disposed over the photovoltaic element. In one embodiment, the transparent conductive layer includes lithium and fluorine-co-doped tin oxides, and the lithium and fluorine-co-doped tin oxides includes a plurality of polyhedron grains, and the polyhedron grains have a polyhedron grain distribution density of 60-95%.

16 Claims, 14 Drawing Sheets

SOLAR CELL DEVICE

CROSS REFERENCE TO RELATED APPLICATIONS

This application is a Continuation-In-Part of pending U.S. patent application Ser. No. 12/754,544, filed Apr. 5, 2010 and entitled "Solar cell device and method for fabricating the same", which claims priority of Taiwan Patent Application No. 98135353, filed on Oct. 20, 2009. This application also claims priority of Taiwan Patent Application No. 99135177, filed on Oct. 15, 2010, the entirety of which is incorporated by reference herein.

BACKGROUND OF THE INVENTION

1. Field of the Invention

The invention relates to solar cell fabrication, and in particular to a solar cell device with transparent conductive films having improved light scattering characteristics and a method for fabricating the same.

2. Description of the Related Art

Demand and application for transparent conductive films have increased, due to increased development and use of solar cell devices. In addition to solar cell devices, other examples of electronic devices using flat display panels, such as liquid crystal displays, electroluminescence panels, plasma display panels, field emission displays, and touch panels all apply transparent conductive films as electrode materials therein.

FIG. 1 is a cross section showing a transparent conductive film used in a conventional solar cell device. As shown in FIG. 1, the solar cell device is illustrated as an Silicon thin film solar cell device 100, including main components such as a transparent conductive layer 104 made of fluorine doped tin oxide (FTO), an amorphous silicon thin film photovoltaic element 150 and an electrode layer 112 sequentially disposed over a glass substrate 102. The amorphous silicon thin film photovoltaic element 150 comprises components such as a p-type amorphous silicon layer, an intrinsic amorphous silicon layer 108 and an n-type amorphous silicon layer 110 sequentially stacked over the transparent conductive layer 104.

As shown in FIG. 1, the transparent conductive layer 104 made of fluorine doped tin oxide (FTO) has efficient light trapping ability. The transparent conductive layer 104 made of fluorine doped tin oxide (FTO), however, is formed with a planar configuration, and most light components of the incident light 180 such as sun light may directly strike and penetrate the amorphous silicon thin film photovoltaic element 150, but not produce photovoltaic reactions. Since incident light 180 from the outside of the glass substrate 102 passes through the transparent 102 and the transparent conductive layer 104, utility rate of the incident light 180 by the amorphous silicon thin film photovoltaic element 150 is affected.

Therefore, a transparent conductive layer with improved light scattering characteristics is needed to increase the utility rate of incident light of a solar cell device.

BRIEF SUMMARY OF THE INVENTION

A solar cell device is provided.

An exemplary solar cell device comprises a transparent substrate, a transparent conductive layer disposed over the transparent substrate, a photovoltaic element disposed over the transparent conductive layer, and an electrode layer disposed over the photovoltaic element. In one embodiment, the transparent conductive layer comprises lithium and fluorine co-doped tin oxides, and the lithium and fluorine co-doped tin oxides comprises a plurality of polyhedron grains, and the polyhedron grains have a polyhedron grain distribution density of 60-95%.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-5 are cross sections showing a method for fabricating a solar cell device according to an embodiment of the invention.

Figure 2:
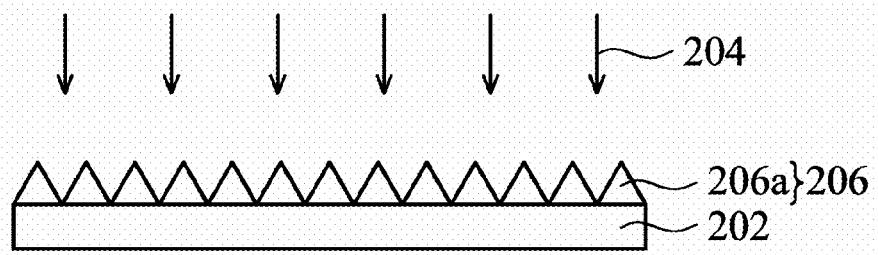
FIGS. 2-5 are cross sections showing a method for fabricating an Solar cell device according to an embodiment of the invention.

As shown in FIG. 2, a transparent substrate 202, such as a glass substrate, a polymer thin film or a flexible substrate, is first provided. Next, a thin film deposition process 204 is performed to form a transparent conductive layer 206 over the transparent substrate 202. The thin film deposition process 204 can be, for example, a chemical spraying process or an atmosphere chemical synthesizing process, and the transparent conductive layer 206 may be formed with a material such as lithium and fluorine co-doped tin oxide (Li—F:$SnO_2$) having a lithium doping concentration of about 0.2-2.3 at % and a fluorine doping concentration of about 0.2-2.5 at %, or preferably having a lithium doping concentration of about 0.2-1.0 at % and a fluorine doping concentration of about 0.5-1.0 at %. Herein, the transparent conductive layer 206 formed by the thin film deposition process 204 comprises a plurality of polyhedron grains 206a formed on a top surface of the transparent substrate 202, thereby showing a non-planar surface configuration rather than the planar configuration of the transparent layer made of conventional fluorine-doped tin oxides. The polyhedron grains 206a in the transparent conductive layer 206 are provided with a polyhedron grain distribution density of about 60-95%. The polyhedron grain distribution density described above is defined as a ratio of a surface area occupied by the polyhedron grains 206a in the transparent conductive layer 206 to a unit surface area.

Figure 3:
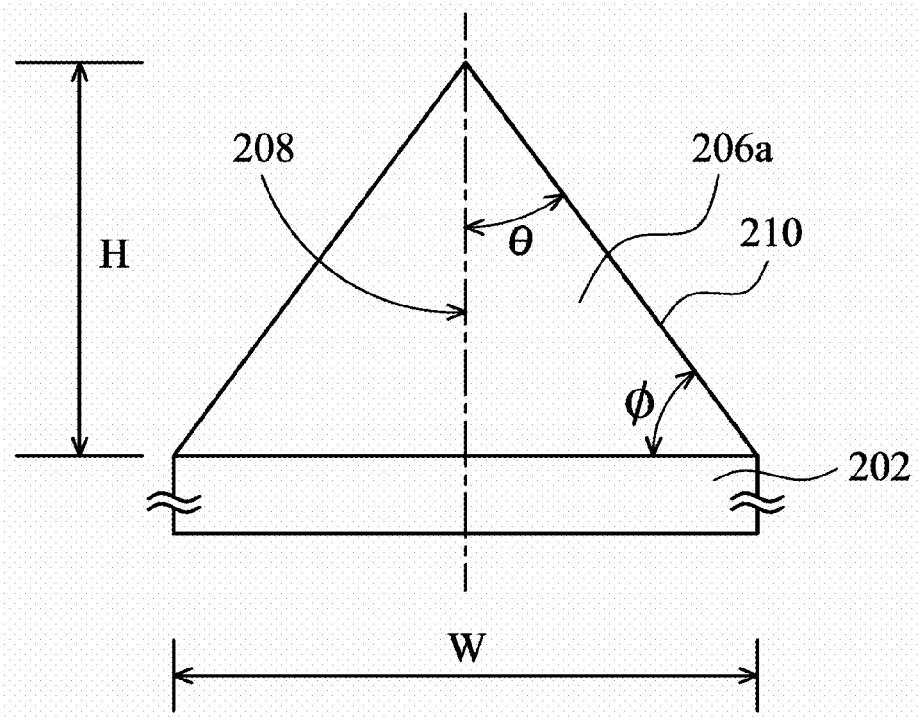

In FIG. 3, an enlargement of one of the polyhedron grains 206a is illustrated. As shown in FIG. 3, the polyhedron grain 206a comprises a plurality of sidewall surfaces, wherein the number of sidewall surfaces is at least three or greater and a normal line 208 perpendicular to a top surface of the transparent substrate 202. An included angle of about 45°-90° is provided between one of the sidewall surfaces 210 and the transparent substrate 202, and an included angle θ of about 0°-45° is provided between the normal line 208 and each of the sidewall surfaces 210. A bottom surface of the polyhedron grain 206a is formed with a diameter W of about 100-2000 nm, and each of the polyhedron grain 206a has a thickness H of about 300-1000 nm.

In one embodiment, while the transparent conductive layer 204 is formed by the chemical spraying process, droplets having an Size of about 5-15 μm formed by a gaseous mixture including carrier gases such as air, oxygen, nitrogen, and reaction gases such as Sn(OH)$_4$, $NH_4F$, LiF and Li(OH) are formed under a temperature of about 200-650° C. by an atomizer having a oscillation frequency of about 1.5 KHz-2.6 Mhz or a fine nozzle having an opening of about 10 μm and provided to the heated transparent substrate 202 to thereby form the transparent conductive layer 206 comprising the polyhedron grains 206a.

Since the transparent conductive layer 206 is composed of the plurality of the polyhedron grains 206a, it has a non-planar top surface and a higher haze level of about 20-60%. Note that the polyhedron grains 206a in the transparent conductive layer 206 are advantageous for scattering light illuminated on the solar cell device and passes thereof into the sequential layers. Thus, light components reaching the photovoltaic conversion element and photovoltaic conversion efficiency of the photovoltaic conversion element are increased. In one embodiment, according to a bi-directional reflectance distribution function measurement method, the transparent conductive layer 206 formed of the polyhedron grains 206a obtained in the thin film deposition process 204 may show a light field distribution angle of about 40°-80°, or preferable of about 45°-60°.

Figure 4:
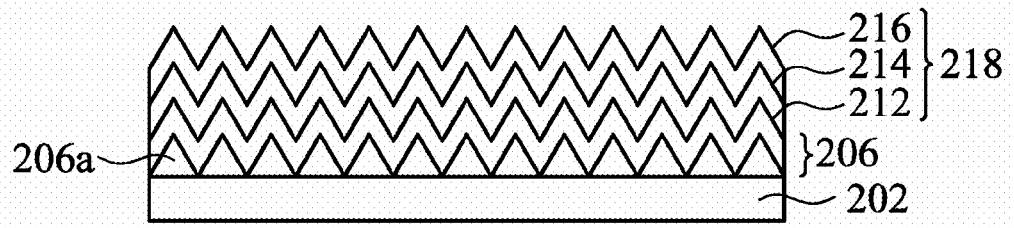

In FIG. 4, a thin film deposition process (not shown) is performed to form a photovoltaic element 218 over the transparent conductive layer 206 illustrated in FIG. 2. Herein, the photovoltaic element 218 is illustrated as an amorphous silicon p-i-n photovoltaic structure, but is not limited thereto. The photovoltaic element 218 can be formed as other types of photovoltaic structures such as a dye sensitized solar cell (DSSC) structure, a nanocrystalline silicon structure, or a photovoltaic element formed with a tandem structure. In the thin film deposition process, a p-type amorphous silicon layer 212 is first formed over the transparent conductive layer 206, an intrinsic (non-doped) amorphous silicon layer 214 is then formed over the p-type amorphous silicon layer 212, and an n-type amorphous silicon layer 216 is then formed over the intrinsic amorphous silicon layer 214. As shown in FIG. 4, if the transparent conductive layer 206 is formed with a non-planar top surface such as a concave-convex configuration, then the n-type amorphous silicon layer 216, the intrinsic amorphous silicon layer 214, and the p-type amorphous silicon layer 212 conformably formed over the transparent conductive layer 206 would also have a non-planar top surface such as a concave-convex configuration. The thin film deposition process can be in-situ performed in the same processing apparatus, wherein the three films of the photovoltaic element 218 are in-situ doped with predetermined types of dopants. Therefore, no additional ion implanting processes is needed. Thus, simplifying the fabrication process of the photovoltaic element 218. Herein, the thin film deposition process for forming the photovoltaic element 218 can be, for example, a plasma enhanced chemical vapor deposition process.

Figure 5:
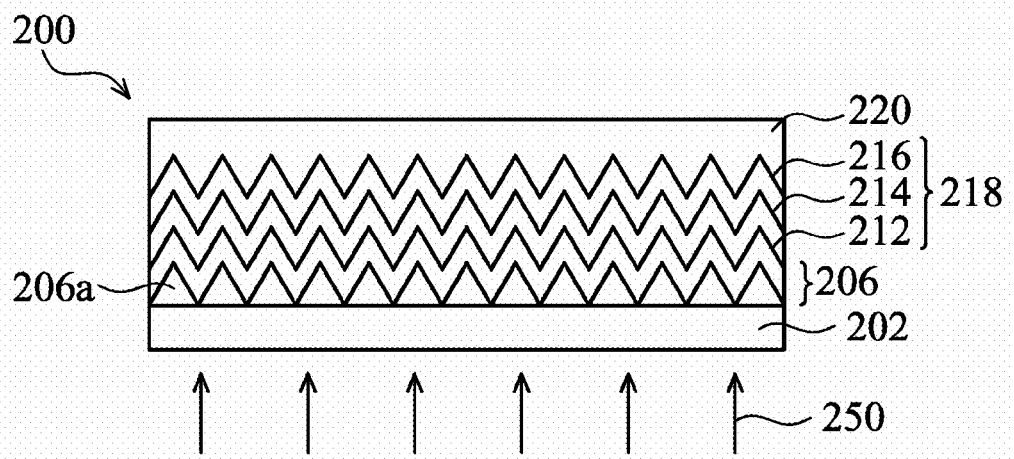

As shown in FIG. 5, a thin film deposition process (not shown) is then performed to form an electrode layer 220 over the photovoltaic element 218 illustrated in FIG. 4. Herein, the thin film deposition process can be a process such as sputtering and the electrode layer 220 may comprise materials such as Al, Ti, Mo, or Ag. As shown in FIG. 5, an substantially fabricated solar cell device 200 is shown, wherein incident light 250 may pass through the transparent substrate 202 and the transparent conductive layer 206 to arrive on the photovoltaic element 218 to produce photovoltaic conversion reactions.

In the present embodiment, the solar cell device 200 utilizes the transparent conductive layer 206 made of a plurality of polyhedron grains 206a, and the polyhedron grains 206 scatters the incident light 250 passing through the transparent substrate 202, thereby increasing the amount of input light reaching the photovoltaic element 218. Accordingly, the light utilization rate of the incident light 250 of the photovoltaic element 218 is improved. The novel transparent conductive layer may further improve the element performances of the solar cell device.

Figure 6:
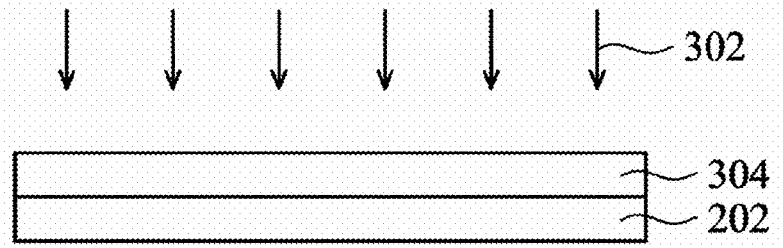
FIGS. 6-7 are cross sections showing a method for fabricating an Solar cell device according to another embodiment of the invention.
Figure 7:
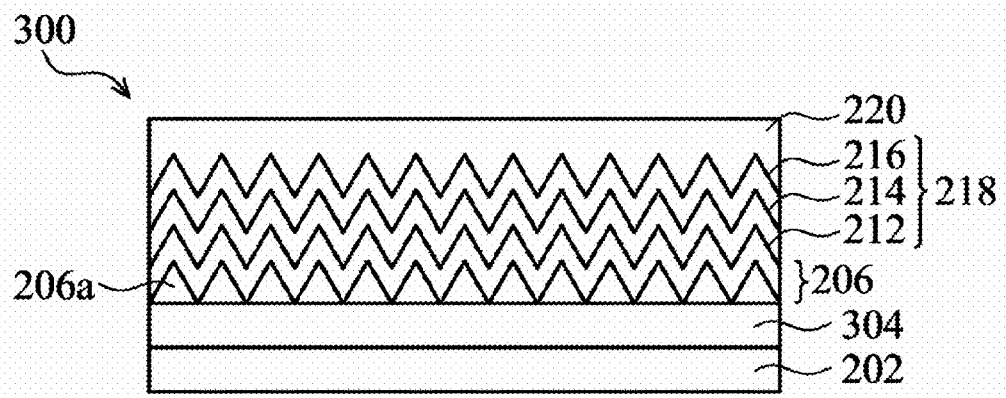

FIGS. 6-7 are cross sections showing a method for fabricating an Solar cell device according to another embodiment of the invention. Herein, this embodiment is modified from the embodiment illustrated in FIGS. 2-5 and only differences therebetween are discussed in the following paragraphs.

In FIG. 6, a transparent substrate 202, such as a glass substrate, a polymer thin film or a flexible substrate, is first provided. Next, a thin film deposition process 302 is performed to form an infrared filter layer 304 over the transparent substrate 202. The thin film deposition process 302 can be, for example, a chemical spraying process or an atmosphere chemical synthesizing process operated under a temperature of about 200-650° C., and the formed infrared filter layer 304 may be formed with a material such as lithium and fluorine-co-doped tin oxides (Li—F:$SnO_2$) having a lithium doping concentration of about 1.5-3.5 at % and a fluorine doping concentration of about 0.6-3.5 at %, or fluorine and aluminum-co-doped zinc oxides (F—Al:ZnO) having a fluorine doping concentration of about 0.1-2.0 at % and an aluminum doping concentration of about 1-5 at %. In one embodiment, the infrared filter layer 304 is formed with a thickness of about 10-2000 nm and has a visible light transmission rate of more than 70%, an infrared blocking rate of greater than 30%, and a visible light haze level of less than 5%, thereby lowering the transmission rate of infrared wavelength light components (between 1100-1800 nm) in the light passing through the transparent substrate 202. Herein, the infrared filter layer 304 formed by the thin film deposition process 302 is formed on the transparent substrate 202 and has a planar surface configuration.

In one embodiment, while the infrared filter layer 304 is formed by the chemical spraying process, droplets having an Size of about 5-80 μm formed by a gaseous mixture including carrier gases such as air, oxygen, nitrogen, and reaction gases such as $Sn(OH)_4$, $NH_4F$, $LiF$ and $Li(OH)$ are formed under a temperature of about 200-650° C. by an atomizer having a oscillation frequency of about 1.5 KHz-2.6 Mhz or a fine nozzle having an opening of about 10 μm and provided to the heated transparent substrate 202 to thereby form the infrared filter layer 304.

As shown in FIG. 7, the transparent conductive layer 206, the photovoltaic element 218, and the electrode layer 220 are sequentially formed over the infrared filter layer 304 by the processes illustrated in FIGS. 2-5, thereby completing fabrication of an Solar cell device 300. In this embodiment, the solar cell 300 may have advantages such as improved light utilization rate of the incident light 250 by the photovoltaic element 218 of the solar cell device 200, and prevention of infrared wavelength light components of the incident light 250 transmitted into the solar cell device 300 from reaching the photovoltaic element 218. Thus, temperature increase of the photovoltaic element 218 due to absorption of incident light 250 is prevented and the photovoltaic efficiency of the photovoltaic element 218 is not affected by negative influences for conditions such as high operating temperature. The infrared filter layer 304 in the solar cell device 300 may thus improve operating stability and increase the lifespan of the solar cell device 300.

Figure 12:
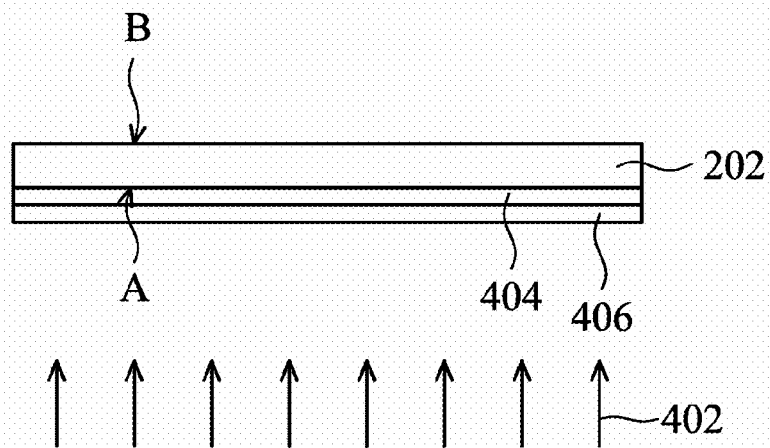
FIGS. 12-13 are cross sections showing a method for fabricating an Solar cell device according to another embodiment of the invention.
Figure 13:
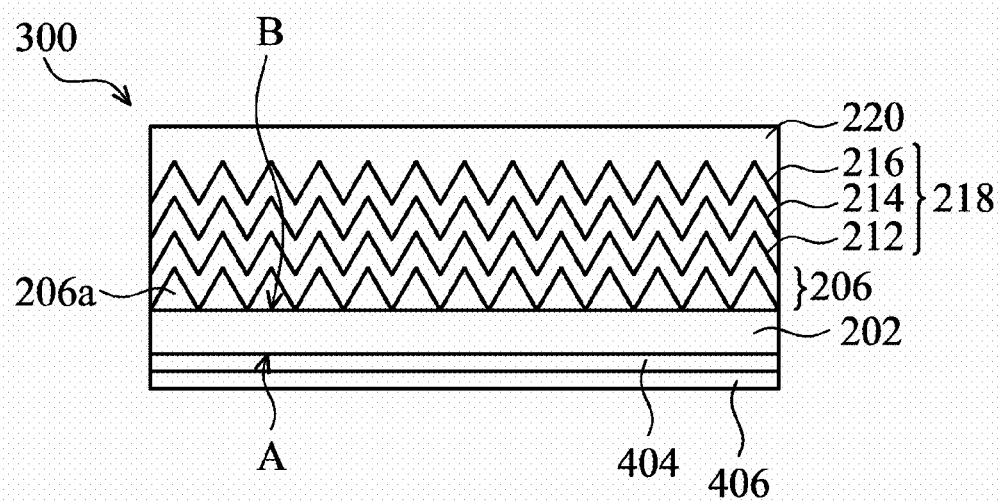

FIGS. 12-13 are cross sections showing a method for fabricating an Solar cell device according to another embodiment of the invention. Herein, this embodiment is modified from the embodiment illustrated in FIGS. 2-5 and only differences therebetween are discussed in the following paragraphs.

In FIG. 12, a transparent substrate 202, such as a glass substrate, a polymer thin film or a flexible substrate, is first provided, having opposite surfaces A and B. Next, a thin film deposition process (not shown) is performed to form an infrared filter layer 404 over the surface A of the transparent substrate 202. Next, a thin film deposition process 402 is performed to form an anti-reflection layer 406 over the infrared filter layer 404.

In one embodiment, the thin film deposition process for forming the infrared filter layer 404 can be, for example, a chemical spraying process or an atmosphere chemical synthesizing process operated under a temperature of about 340-650° C. The infrared filter layer 404 may be formed of a material such as lithium, gallium, fluorine or antimony doped tin oxide with a doping concentration of about 0.6-3.5 at % therein. While the infrared filter layer 404 is formed of fluorine doped tin oxides, a lithium doping concentration of about 1.5-3.5 at % can be optionally provided therein. In one embodiment, while the infrared filter layer 404 is formed by the chemical spraying process, droplets having an Size of about 5-80 μm are formed by a gaseous mixture including carrier gases such as air, oxygen, nitrogen, and reaction gases such as $Sn(OH)_4$, $NH_4F$, $LiF$ and $Li(OH)$ are formed under a temperature of about 300-550° C. by an atomizer having a oscillation frequency of about 1.5 KHz-2.6 Mhz or a fine nozzle having an opening less than 10 μm and provided to the heated transparent substrate 202 to thereby form the infrared filter layer 404. In one embodiment, the infrared filter layer 404 is formed with a thickness of about 100-600 nm, or preferably of about 100-300 nm, and has a visible light refractive index (n) of above 1.8-2.5, a visible light transmission rate of more than 80%, an infrared blocking rate of greater than 30%, and a visible light haze level of less than 2%, thereby lowering the transmission rate of infrared wavelength light components (between 1100-1800 nm) in the light passing through the transparent substrate 202 to a level of under 40%. Herein, the infrared filter layer 404 formed on the transparent substrate 202 has a planar surface configuration.

In one embodiment, the thin film deposition process 402 for forming the anti-reflection layer 406 can be, for example, a chemical spraying process or an atmosphere chemical synthesizing process operated under a temperature of about 100-250° C., and the formed anti-reflection layer 406 may be formed of a material such as silicon dioxide or magnesium fluoride. In one embodiment, the anti-reflection layer 406 is formed with a thickness of about 100-180 nm, or preferably of about 100-150 nm, and has a visible light refractive index (n) of above 1.2-1.45, a visible light transmission rate of more than 90%, and a visible light haze level of less than 2%. The anti-reflection layer 406 will not affect the infrared filtering performance of the infrared filter layer 404 thereunder and may improve a transmittance waveband of visible light reaching and transmitting the transparent substrate 202 to a level over 90%. Herein, the anti-reflection layer 406 formed on the infrared filter layer 404 by the thin film deposition process 402 has a planar surface configuration.

As shown in FIG. 13, the transparent conductive layer 206, the photovoltaic element 218, and the electrode layer 220 are sequentially formed over the surface B of the transparent substrate by the processes illustrated in FIGS. 2-5, thereby completing fabrication of an Solar cell device 300. In this embodiment, the solar cell 300 may have advantages such as improving light utilization rate of the incident light 250 by the photovoltaic element 218 of the solar cell device 200 (shown in FIG. 5), and may include other advantages such as preventing of infrared wavelength light components of the incident light 250 transmitted into the solar cell device 300 from reaching the photovoltaic element 218 by use of the infrared filter layer 404. Thus, temperature increases of the photovoltaic element 218 due to absorption of incident light 250 can be prevented and the photovoltaic efficiency of the photovoltaic element 218 can be protected from negative influences such as high operating temperatures. In addition, the light components of visible light wavelengths of the incident light 250 transmitted into the solar cell device 300 and reaching the photovoltaic element 218 can be increase by use of the anti-reflection layer 406. Herein, a new composite film structure including the infrared filter layer 404 and the anti-reflection layer 406 is capable of improving operating stability and increasing lifespan of an Solar cell device 300.

Figure 1:
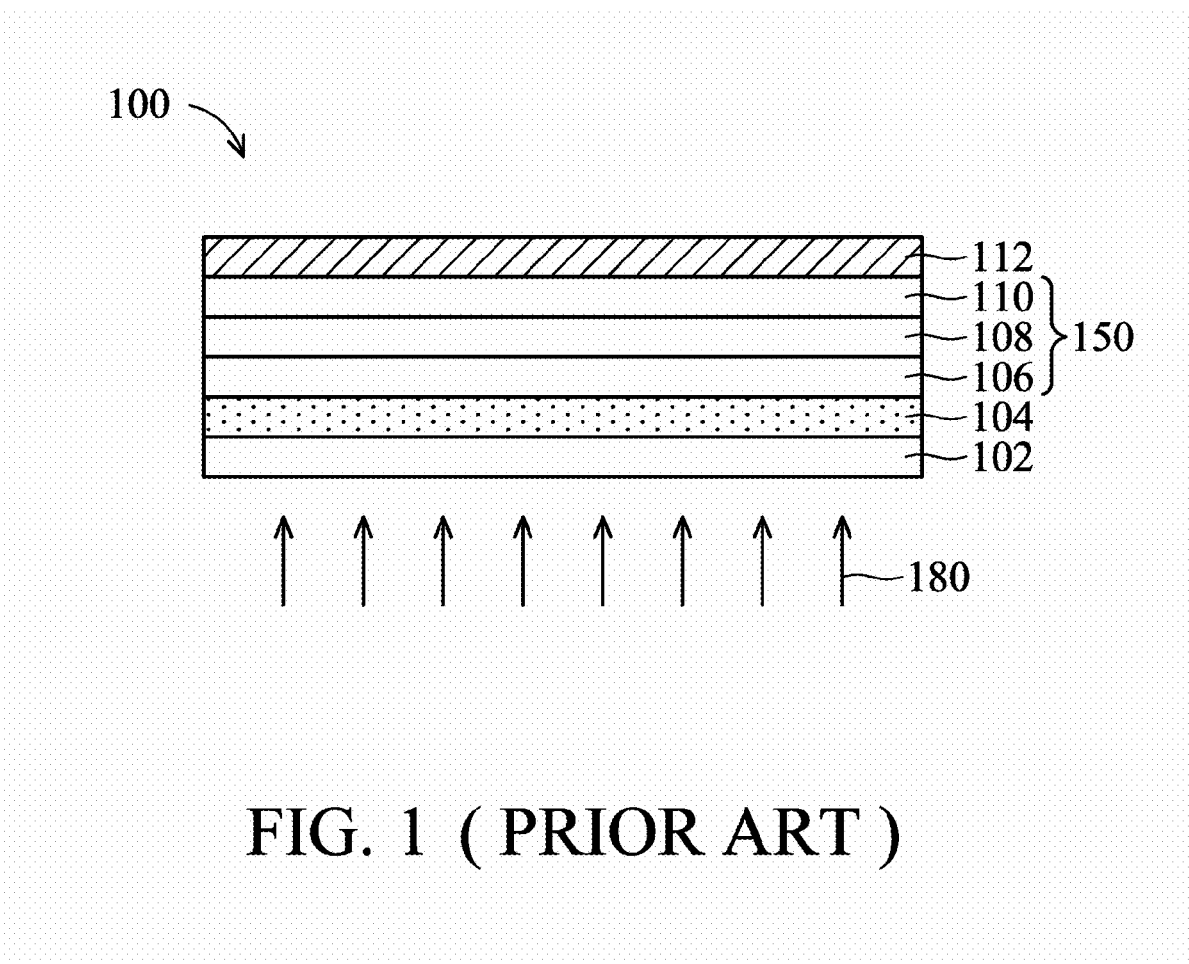
FIG. 1 is a cross section of a conventional solar cell device.
Figure 14:
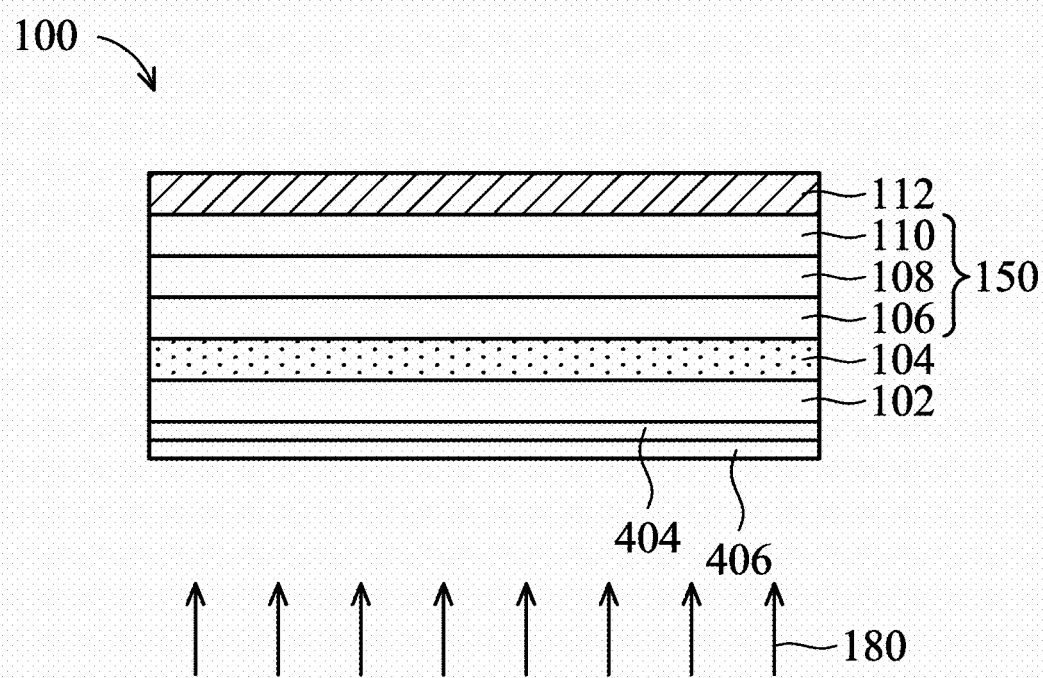
FIG. 14 shows an Solar cell device according to another embodiment of the invention.

As shown in FIG. 14, the new composite film structure including the infrared filter layer 404 and the anti-reflection layer 406 is not only capable of being applied in the solar cell device 300, as shown in FIG. 13, but also is capable of being applied in a conventional silicon thin film solar cell device 100, as shown in FIG. 1, to improve operating stability and increase lifespan thereof. Herein, this embodiment is modified from the embodiment illustrated in FIG. 1 and only differences therebetween are discussed in the following paragraphs.

In this embodiment, the infrared filter layer 404 and the anti-reflection layer 406 in the composite film are sequentially formed over an Surface of the glass substrate 102 opposite to another surface thereof having main components such as the transparent conductive layer 104 made of fluorine doped tin oxide (FTO), the amorphous silicon thin film photovoltaic element 150 and the electrode layer 112 formed thereover. The glass substrate 102 is not limited to an Substrate made of glass and can be replaced by other transparent substrates such as a polymer thin film or a flexible substrate. As described above, infrared wavelength light components of the incident light 180 transmitted into the solar cell device 100 can be reduced from reaching the photovoltaic element 150 by use of the infrared filter layer 404. Thus, temperature increases of the photovoltaic element 150 due to absorption of infrared wavelength light components of the incident light 180 can be prevented and the photovoltaic efficiency of the photovoltaic element 150 can be protected from negative influences such as high operating temperature. In addition, light components of visible light wavelengths of the incident light 180 transmitted into the solar cell device 100 and reaching the photovoltaic element 150 can be increased by use of the anti-reflection layer 406. The use of the composite film structure including the infrared filter layer 404 and the anti-reflection layer 406 is capable of improving operating stability and increasing lifespan of an Solar cell device 300.

EMBODIMENTS

Embodiment 1

Fabrication of a Transparent Conductive Layer Comprising Polyhedron Grains

Figure 17:
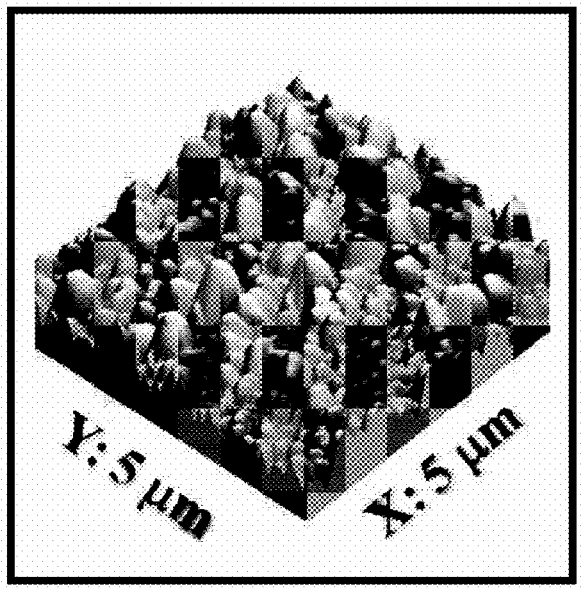
FIG. 17 shows a surface distribution configuration of a transparent conductive layer according to an embodiment of the invention.

An aqueous solution including a 0.3 mole of SnCl2.5H2O was provided, and a 0.06 mole of NH4F and a 0.09 mole of LiCl were then co-doped with the solution to obtain a mixed solution. Air was simultaneously conducted in a micro type droplet atomizer, and an atomizer in the micro type droplet atomizer was adjusted to uniformly mix the mixed solution with the air. A mixture of the mixed solution and the air was directly directed to a glass sample heated to a temperature of about 400° C. to perform chemical vapor deposition, thereby forming an SnO2:Li:F (Li—FTO) transparent conductive film comprising a plurality of polyhedron grains as illustrated in FIG. 2 and having a non-planar surface configuration such as a concave-convex surface. The Li—FTO transparent conductive film was formed with a thickness of about 800 nm and the polyhedron grains therein had a measured diameter of about 200-300 nm. Herein, a lithium doping concentration in the Li—FTO transparent conductive layer of about 0.3 at % and a fluorine doping concentration in the Li—FTO transparent conductive layer of 0.5 at % were measured. A light field distribution angle of about 45°-55° of the Li—FTO transparent conductive layer was also measured. A polyhedron grain distribution density of about 65% of the polyhedron grains formed in the Li—FTO transparent conductive layer was measured by an atomic force microscope (AFM), and a surface distribution configuration of the Li—FTO transparent conductive layer having the polyhedron grains is shown in FIG. 17.

Embodiment 2

Fabrication of a Transparent Conductive Layer Comprising Polyhedron Grains

Figure 18:
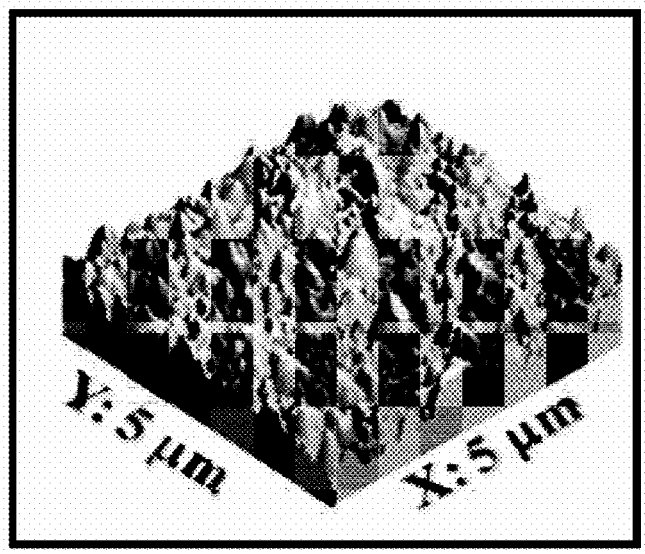
FIG. 18 shows a surface distribution configuration of a transparent conductive layer according to another embodiment of the invention.

An aqueous solution including a 0.3 mole of SnCl2.5H2O was provided, and a 0.06 mole of NH4F and a 0.09 mole of LiCl were then co-doped with the solution to obtain a mixed solution. Air was simultaneously conducted in a micro type droplet atomizer, and an atomizer in the micro type droplet atomizer was adjusted to uniformly mix the mixed solution with the air. A mixture of the mixed solution and the air was directly directed to a glass sample heated to a temperature of about 450° C. to perform chemical vapor deposition, thereby forming an SnO2:Li:F (Li—FTO) transparent conductive film comprising a plurality of polyhedron grains as illustrated in FIG. 2 and having a non-planar surface configuration such as a concave-convex surface. The Li—FTO transparent conductive film was formed with a thickness of about 800 nm and the polyhedron grains therein had a measured diameter of about 500-600 nm. Herein, a lithium doping concentration in the Li—FTO transparent conductive layer of about 0.5 at % and a fluorine doping concentration in the Li—FTO transparent conductive layer of 0.3 at % were measured. A light field distribution angle of about 65°-75° of the Li—FTO transparent conductive layer was also measured. A polyhedron grain distribution density of about 75% of the polyhedron grains formed in the Li—FTO transparent conductive layer was measured by an atomic force microscope (AFM), and a surface distribution configuration of the Li—FTO transparent conductive layer having the polyhedron grains is shown in FIG. 18.

Comparative Embodiment 1

Fabrication of a Transparent Conductive Layer with a Planar Configuration

Figure 19:
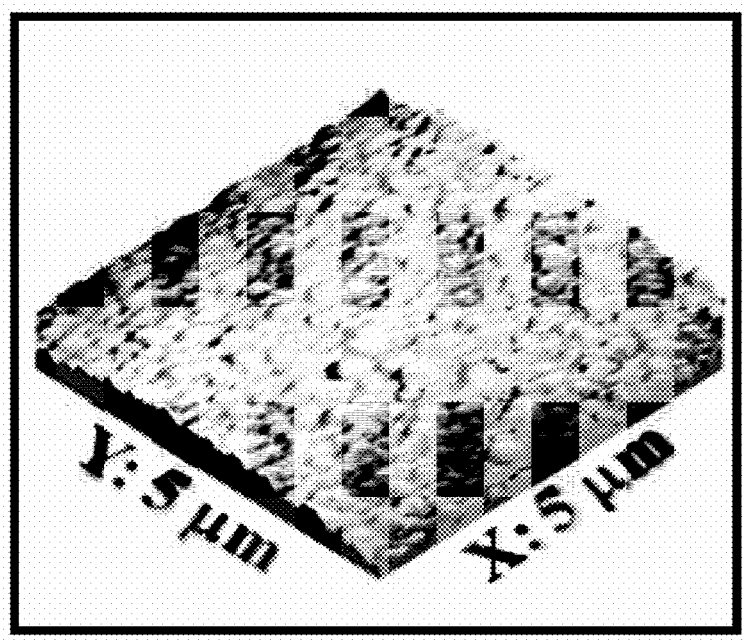
FIG. 19 shows a surface distribution configuration of a transparent conductive layer according to a comparative embodiment of the invention.

An aqueous solution including a 0.3 mole of $SnCl_2.5H_2O$ was provided, and a 0.045 mole of $NH_4F$ and a 0.009 mole of LiCl were then co-doped with the solution to obtain a mixed solution. Air was simultaneously conducted in a micro type droplet atomizer, and an atomizer in the micro type droplet atomizer was adjusted to uniformly mix the mixed solution with the air. A mixture of the mixed solution and the air was directly directed to a glass sample heated to a temperature of about 360° C. to perform chemical vapor deposition, thereby forming an SnO2:Li:F (Li—FTO) transparent conductive film similar with that illustration in FIG. 1 which is formed with a planar surface configuration. The Li—FTO transparent conductive film was formed with a thickness of about 800 nm. Herein, a lithium doping concentration in the Li—FTO transparent conductive layer was less than 0.1 at %. A polyhedron grain distribution density less than 30% of the polyhedron grains formed in the Li—FTO transparent conductive layer was measured by an atomic force microscope (AFM), and the transparent conductive layer was formed with a surface configuration similar with that of a planar configuration, wherein the surface distribution configuration of the Li—FTO transparent conductive layer having the polyhedron grains is shown in FIG. 19.

Light Reflection Tests

Figure 8:
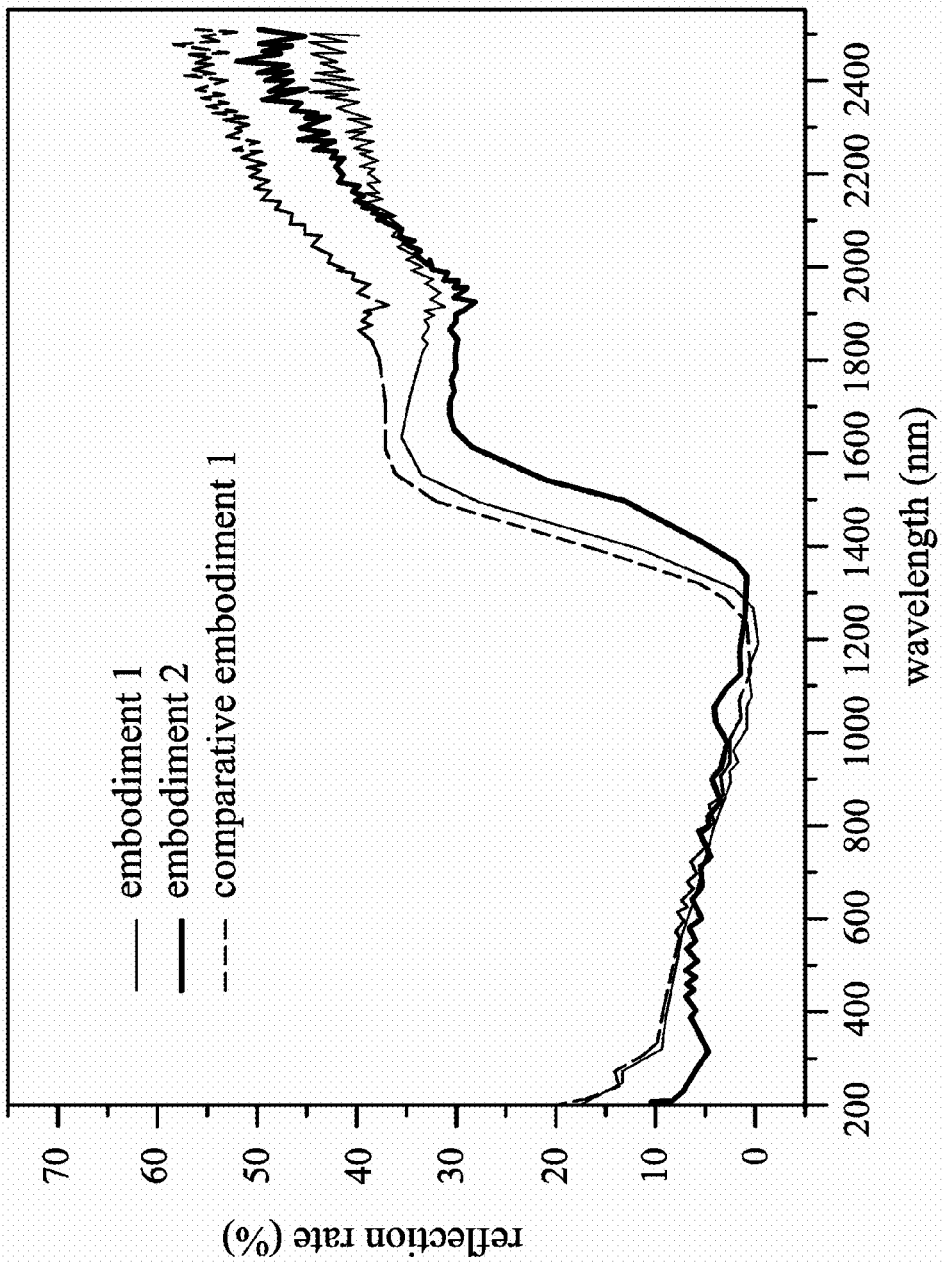
FIG. 8 shows the reflection rate of a transparent conductive layer of an Solar cell device according to an embodiment of the invention and a comparative embodiment.

FIG. 8 shows light reflection results of the transparent conductive layers provided by Embodiments 1-2 and Comparative Embodiment 1 obtained by reflectance spectroscopy. Light reflection rate of the transparent conductive layers in Embodiments 1-2 and Comparative Embodiment 1 were significantly changed according to the lithium doping concentration therein. As shown in FIG. 8, with the transparent conductive layer having a lithium doping concentration of about 0.3 at % (embodiment 1) and a 0.5 at % (embodiment 2) being provided, a maximum reflection rate of about 30% of incident light having a wavelength of about 1200-1800 nm was obtained. An absorption rate of about 40%-50% of incident light having a wavelength of about 1200-1800 nm was obtained when the lithium doping concentration of the transparent conductive layer was lower than 0.2 at %.

Light Absorption Tests

Figure 9:
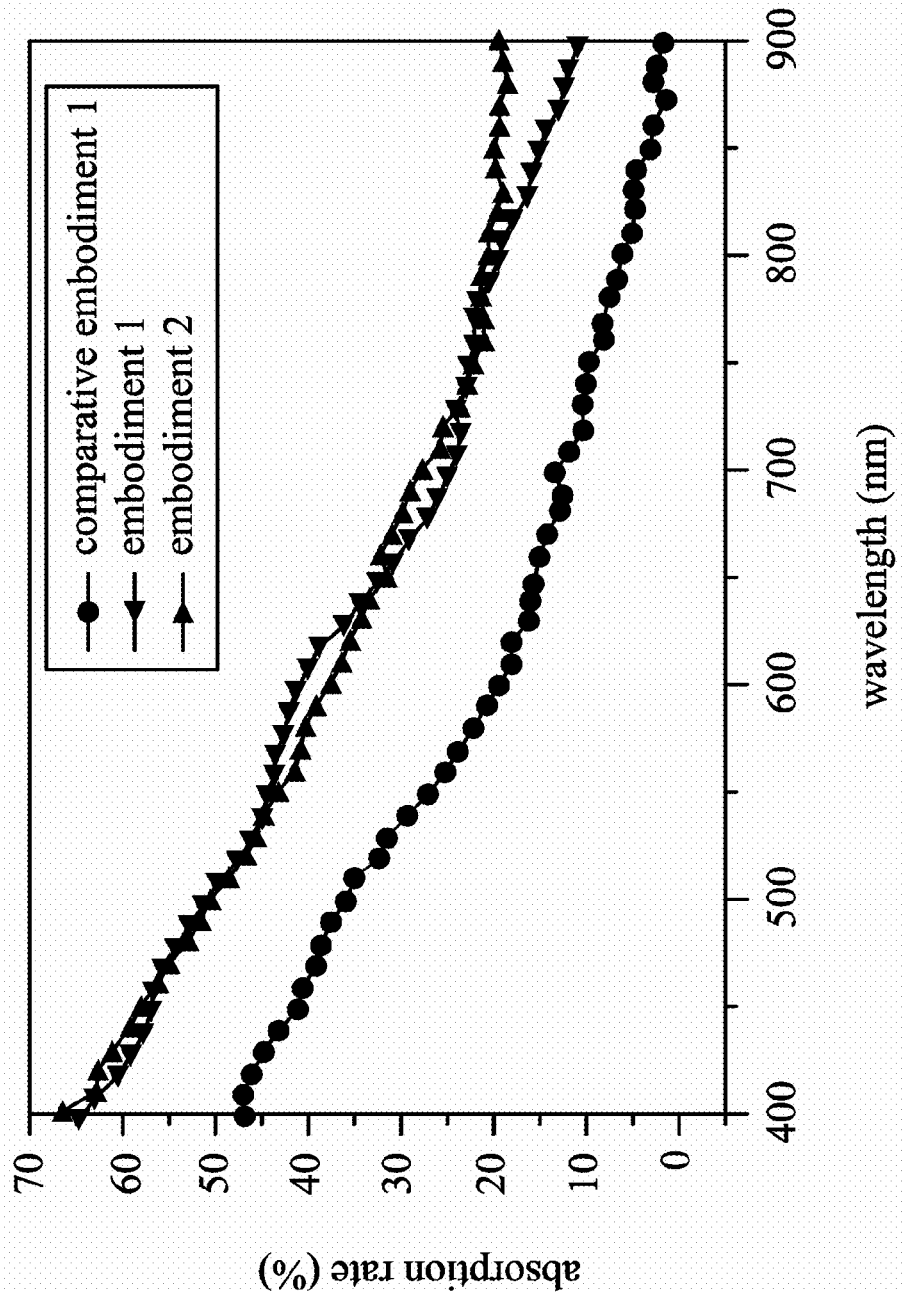
FIG. 9 shows absorption results of a transparent conductive layer of an Solar cell device according to an embodiment of the invention and a comparative embodiment.

FIG. 9 shows light absorption results of the transparent conductive layers provided by Embodiments 1-2 and Comparative Embodiment 1 obtained by absorption spectroscopy. Light absorption rates of the transparent conductive layers in Embodiments 1-2 and Comparative Embodiment 1 were significantly changed according to the lithium doping concentration therein. As shown in FIG. 9, as the transparent conductive layer was provided with a lithium doping concentration of about 0.3 at % (embodiment 1) and a 0.5 at % (embodiment 2), an absorption rate of about 30%-65% of incident light having a wavelength of about 400-800 nm was obtained. An absorption rate of about 10%-50% of incident light having a wavelength of about 400-800 nm was obtained when the transparent conductive layer was formed with a lithium doping concentration of less than 0.2 at %.

Embodiment 3

An aqueous solution including a 0.5 mole of $SnCl_2.5H_2O$ was provided, and a 0.35 mole of $NH_4F$ and a 0.075 mole of LiCl were then co-doped with the solution to obtain an $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with a size of about 5-8 μm. Next, the aerosol airflow was directly directed to a glass sample heated to a temperature of about 400° C. to form an infrared filter layer made of mainly tin oxide, having a thickness of about 1000 nm, by chemical vapor deposition. The atomizer was operated under an oscillation frequency of 1000 KHz and a lithium doping concentration in the infrared filter layer of about 1.5 at % and a fluorine doping concentration in the infrared filter layer of 1.0 at % was measured.

Embodiment 4

An aqueous solution including a 0.5 mole of $SnCl_2.5H_2O$ was provided, and a 0.35 mole of $NH_4F$ and a 0.1 mole of LiCl were then co-doped with the solution to obtain an $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with a size of about 5-8 μm. Next, the aerosol airflow was directly feed to a glass sample heated to a temperature of about 400° C. to form an infrared filter layer made of mainly tin oxide, having a thickness of about 1000 nm, by chemical vapor deposition. The atomizer was operated under an oscillation frequency of 1000 KHz and a lithium doping concentration in the infrared filter layer of about 2.0 at % and a fluorine doping concentration in the infrared filter layer of 2.0 at % were measured.

Embodiment 5

An aqueous solution including a 0.5 mole of $SnCl_2.5H_2O$ was provided, and a 0.35 mole of $NH_4F$ and a 0.125 mole of LiCl were then co-doped with the solution to obtain an $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with a size of about 5-8 μm. Next, the aerosol airflow was directly directed to a glass sample heated to a temperature of about 400° C. to form an infrared filter layer made of mainly tin oxide, having a thickness of about 1000 nm, by chemical vapor deposition. The atomizer was operated under an oscillation frequency of 1000 KHz and a lithium doping concentration in the infrared filter layer of about 2.5 at % and a fluorine doping concentration in the infrared filter layer of 2.6 at % were measured.

Comparative Embodiment 2

An aqueous solution including a 0.5 mole of $SnCl_2.5H_2O$ was provided, and a 0.35 mole of $NH_4F$ were then co-doped to obtain an $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with an Size of about 5-8 μm. Next, the aerosol airflow was directly directed to a glass sample heated to a temperature of about 400° C. to form an infrared filter layer made of mainly tin oxide, having a thickness of about 1000 nm, by chemical vapor deposition. The atomizer was operated under an oscillation frequency of 1000 KHz and a lithium doping concentration in the infrared filter layer of 0 at % and a fluorine doping concentration in the infrared filter layer of 0.5 at % were measured.

Light Reflection Tests

Figure 10:
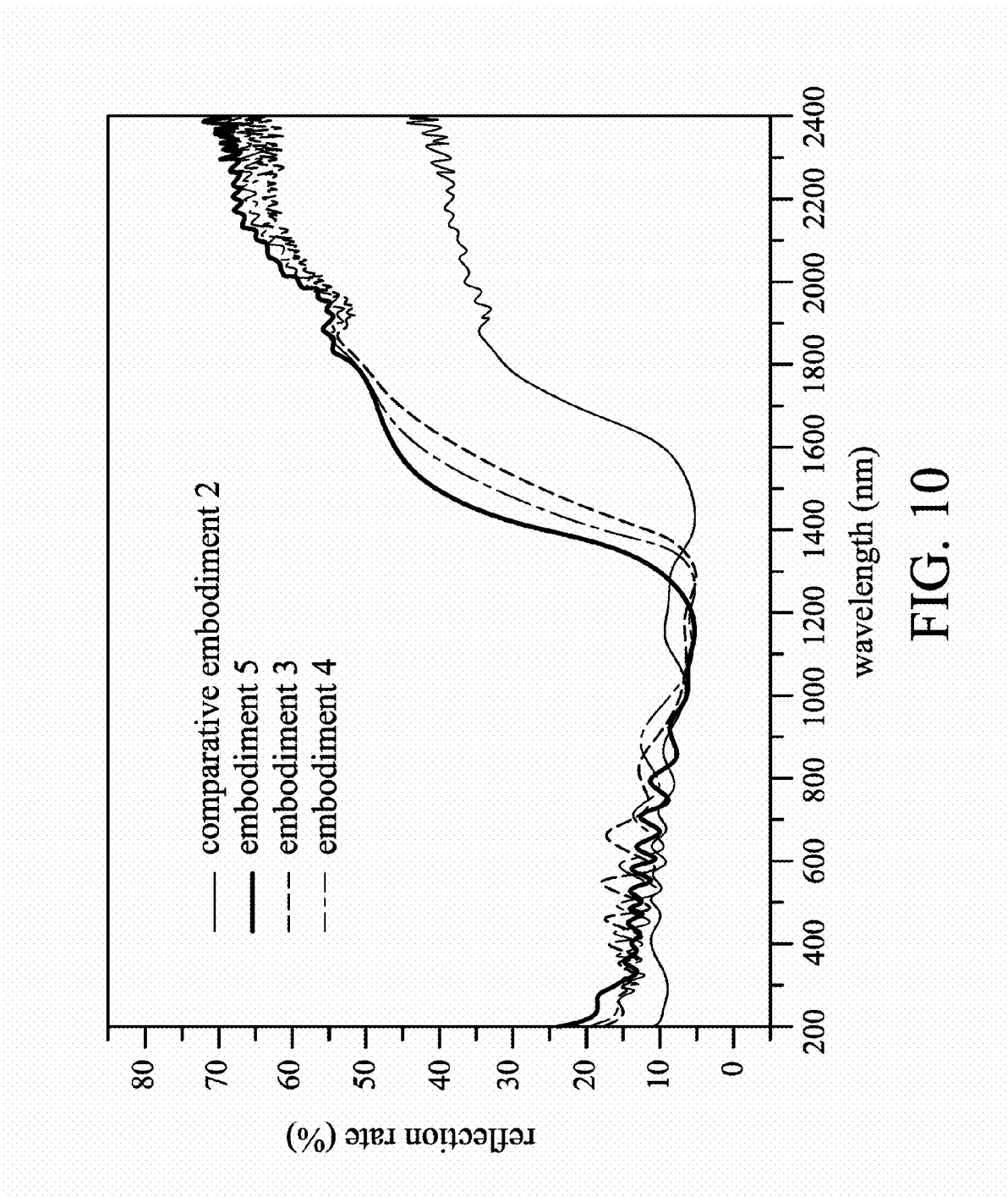
FIG. 10 shows reflection results of an infrared filter layer of an Solar cell device according to an embodiment of the invention and a comparative embodiment.

FIG. 10 shows light reflection results of the infrared filter layers provided by Embodiments 3-5 and Comparative Embodiment 2 obtained by reflectance spectroscopy. The light reflection rate of the infrared filter layers in Embodiments 3-5 and Comparative Embodiment 2 is significantly changed according to lithium doping concentrations and fluorine doping concentrations therein. As shown in FIG. 10, when lithium and fluorine doping concentrations in the infrared filter layers were about 1.5 at % and 1.0 at % (embodiment 3), 2.0 at % and 2.0 at % (embodiment 4), and 2.5 at % and 2.6 at % (embodiment 5), respectively, reflection rates of about 30%, 35%, and 40% of the incident light having a wavelength of about 1500 nm were respectively obtained. A reflection rate of about 5% of incident light having a wavelength of about 1600 nm was obtained when lithium and fluorine doping concentrations in the infrared filter layer were 0 at % and 0.5 at % (comparative embodiment 2).

Light Transmission Tests

Figure 11:
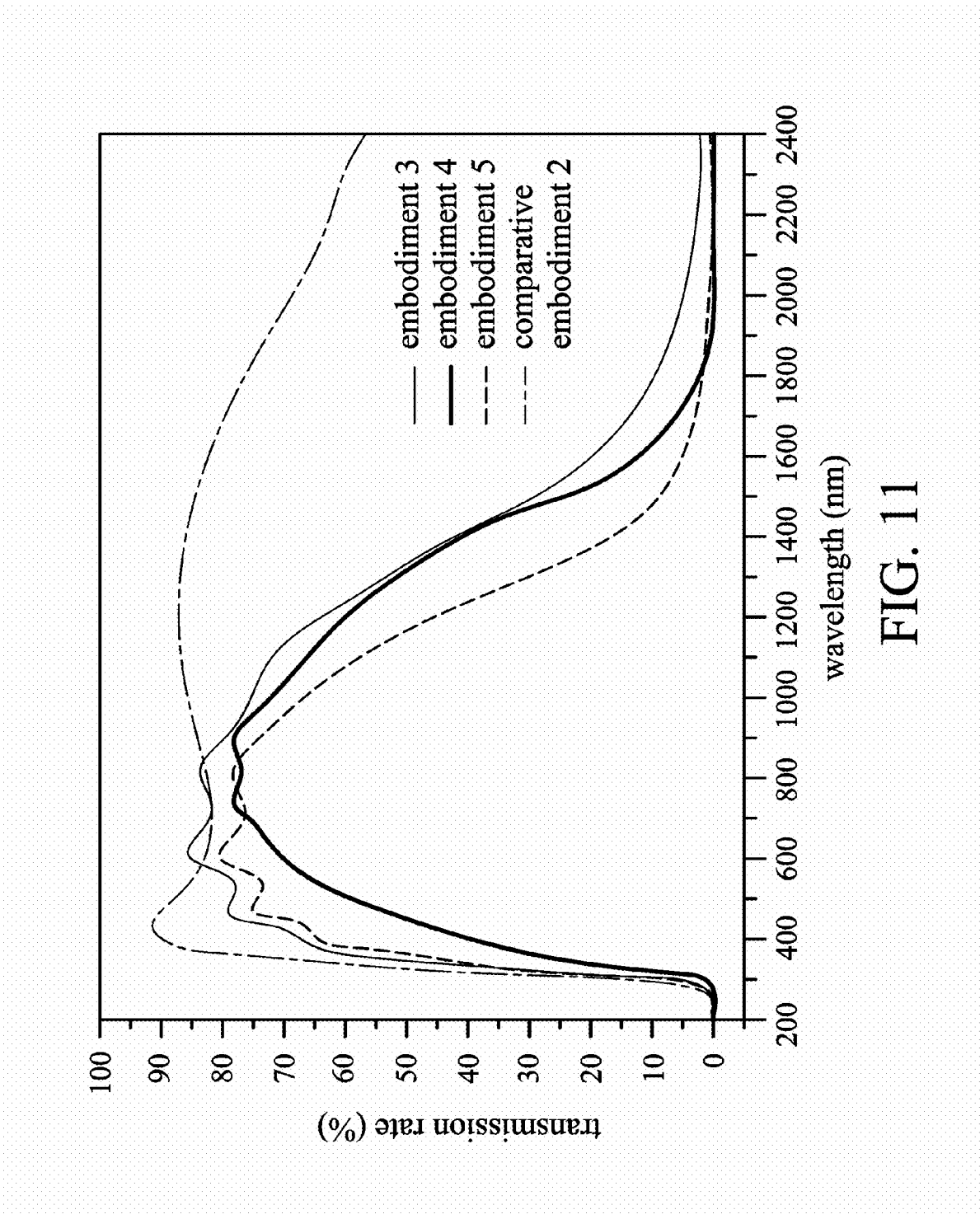
FIG. 11 shows transmission results of an infrared filter layer of an Solar cell device according to an embodiment of the invention and a comparative embodiment.

FIG. 11 shows light transmission results of the infrared filter layers provided by Embodiments 3-5 and Comparative Embodiment 2 obtained by transmission spectroscopy. Light transmission rate of the infrared filter layers in Embodiments 3-5 and Comparative Embodiment 2 were significantly changed according to lithium and fluorine doping concentrations therein. As shown in FIG. 11, when lithium and fluorine doping concentrations in the infrared filter layers were about 1.5% and 1.0% (embodiment 3), 2.0% and 2.0% (embodiment 4), and 2.5 at % and 2.6 at % (embodiment 5), respectively, a light transmission rate of about 30%, 20%, and 10% of incident light having a wavelength of about 1400 nm were respectively obtained. A transmission rate of about 80% of incident light having a wavelength of about 1600 nm was obtained when lithium and fluorine doping concentrations in the infrared filter layer were of 0% and 0.5% (comparative embodiment 2).

Embodiment 6

An aqueous solution including a 0.5 mole of $SnCl_2 \cdot 5H_2O$ was provided, and a 0.25 mole of $NH_4F$ was then doped with the solution to obtain an $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 10 L/min to form an aerosol airflow with a size of about 10-80 μm. Next, the aerosol airflow was directly directed to a glass sample heated to a temperature of about 400° C. to form an infrared filter layer made of mainly fluorine doped tin oxide, having a thickness of about 500 nm, by chemical vapor deposition. The atomizer was operated under an oscillation frequency of 1000 KHz and a fluorine doping concentration in the infrared filter layer of about 1.0 at % was measured. Next, a silicon dioxide thin film having a thickness of about 110 nm was formed over the infrared filter layer by immersion plating. The silicon dioxide thin film had a refractive index (n) of about 1.3.

Embodiment 7

An aqueous solution including a 0.3 mole of $SnCl_2 \cdot 5H_2O$ was provided, and a 0.5 mole of $NH_4F$ was then doped with the solution to obtain an $Sn(OH)_4$-containing solution. Air was simultaneously conducted in a micro type droplet atomizer, and an atomizer in the micro type droplet atomizer was adjusted to uniformly mix the $Sn(OH)_4$-containing solution with the air and then adjusted to a flow rate of about 20 L/min to form an aerosol airflow with a size of about 5-80 μm. Next, the aerosol airflow was directly feed to a glass sample heated to a temperature of about 380° C. to form an infrared filter layer made of mainly fluorine doped tin oxide, having a thickness of about 130 nm, by chemical vapor deposition. The atomizer was operated under an oscillation frequency of 1000 KHz and a fluorine doping concentration in the infrared filter layer of 1.5 at % were measured. Next, a silicon dioxide thin film having a thickness of about 110 nm was formed over the infrared filter layer by immersion plating. The silicon dioxide thin film had a refractive index (n) of about 1.3.

Comparative Embodiments 3-4

Fabrication of the comparative embodiments were similar with that disclosed in the embodiments 6 and 7 except that the anti-reflection layer made of silicon dioxide was not additionally formed after formation of the infrared filter layer made of fluorine doped tin oxide, having a thicknesses of 500 nm and 130 nm.

Light Transmission Tests

Figure 15:
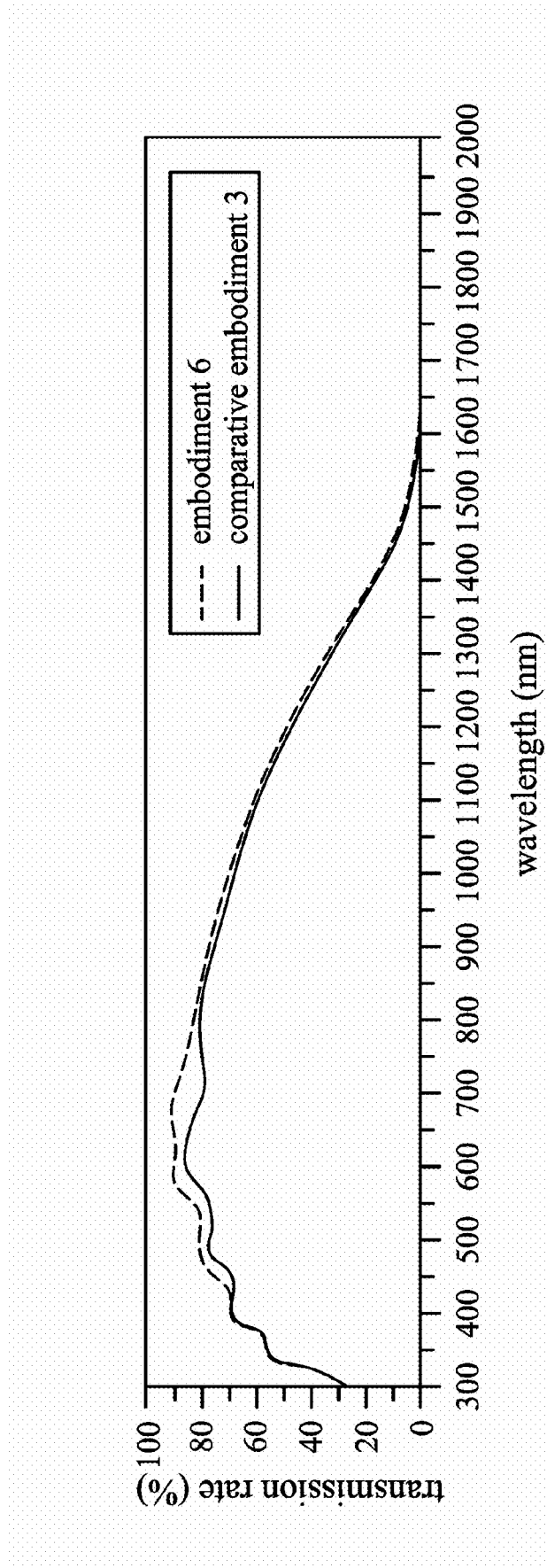
FIG. 15 shows the transmission results of an infrared filter layer of an Solar cell device according to an embodiment of the invention and a comparative embodiment.

FIG. 15 shows light transmission results of the infrared filter layers provided by the Embodiment 6 and the Comparative Embodiment 3 obtained by transmission spectroscopy. A transmission rate lower than 40% under infrared wavelengths (i.e. at a wavelength of 1300 nm) and a transmission rate of about 80% under visible light wavelengths (i.e. at a wavelength of 550 nm) were measured from the sample obtained in the Comparative Embodiment 3 with the infrared filter layer. However, a similar transmission rate lower than 40% under infrared wavelengths (i.e. at a wavelength of 1300 nm) and a transmission rate of about 90% under visible light wavelengths (i.e. at a wavelength of 550 nm) which were greater than that in the Comparative Embodiment 3 were measured from the sample obtained in the Embodiment 6 having the additional anti-reflection layer.

Figure 16:
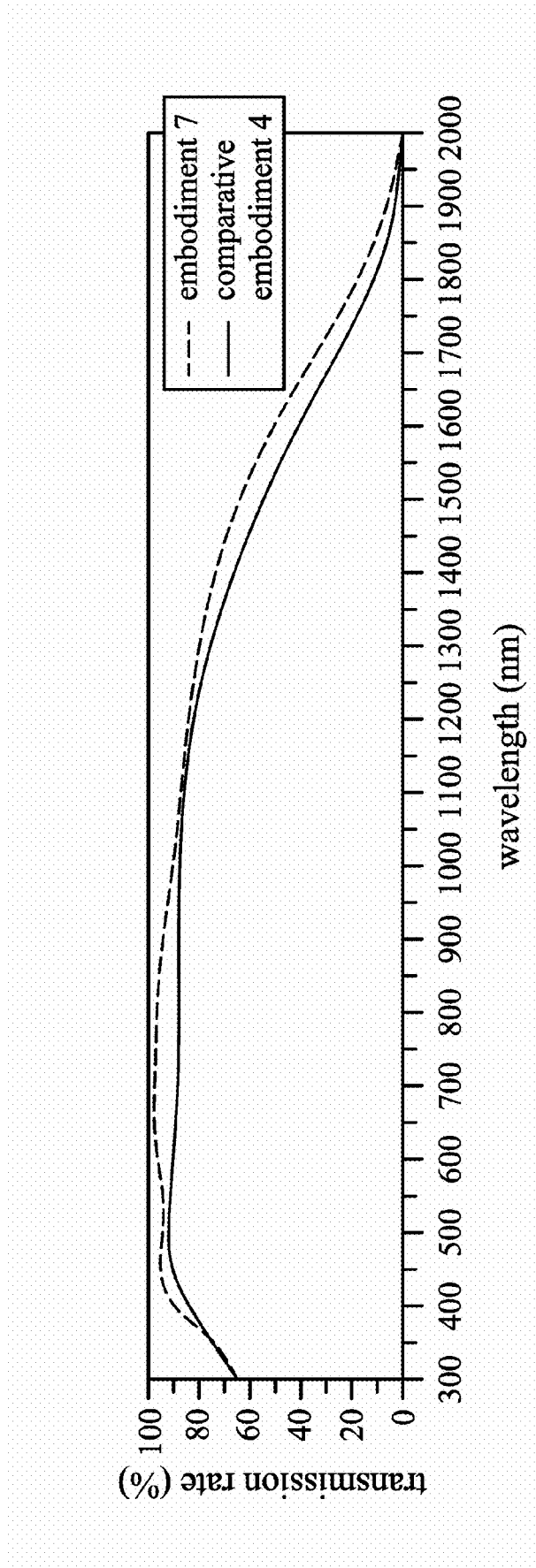
FIG. 16 shows the transmission results of an infrared filter layer of a solar cell device according to an embodiment of the invention and a comparative embodiment.

FIG. 16 shows light transmission results of the infrared filter layers provided by the Embodiment 7 and the Comparative Embodiment 4 obtained by transmission spectroscopy. A transmission rate lower than 40% under infrared wavelengths (i.e. at a wavelength of 1300 nm) and a transmission rate of about 88% under visible light wavelengths (i.e. at a wavelength of 550 nm) were measured from the sample obtained in the Comparative Embodiment 4 with the infrared filter layer. However, a similar transmission rate lower than 40% under infrared wavelengths (i.e. at a wavelength of 1300 nm) and a transmission rate of about 95% under visible light wavelengths (i.e. at a wavelength of 550 nm) which were greater than that in the Comparative Embodiment 4 were measured from the sample obtained in the Embodiment 7 with the additional anti-reflection layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solar cell device, comprising
   a transparent substrate;
   a transparent conductive layer disposed over the transparent substrate, wherein the transparent conductive layer comprises lithium and fluorine-co-doped tin oxides made of a plurality of polyhedron grains with a polyhedron grain distribution density of 60-95%;
   a photovoltaic element disposed over the transparent conductive layer; and
   an electrode layer disposed over the photovoltaic element.

2. The solar cell device as claimed in claim 1, wherein the lithium and fluorine-co-doped tin oxides have a lithium doping concentration of about 0.2-2.3 at % and a fluorine doping concentration of about 0.2-2.5 at %.

3. The solar cell device as claimed in claim 1, wherein the lithium and fluorine-co-doped tin oxides have a lithium doping concentration of about 0.2-1.0 at % and a fluorine doping concentration of about 0.5-1.0 at %.

4. The solar cell device as claimed in claim 1, wherein the transparent conductive layer shows a light field distribution angle of about 40°-80°.

5. The solar cell device as claimed in claim 1, wherein the transparent conductive layer shows a light field distribution angle of about 45°-60°.

6. The solar cell device as claimed in claim 1, wherein the transparent conductive layer has a thickness of about 300-1000 nm.

7. The solar cell device as claimed in claim 2, wherein the polyhedron grains in the transparent conductive layer have a diameter of about 100-2000 nm.

8. The solar cell device as claimed in claim 1, further comprising an infrared filter layer disposed between the transparent conductive layer and the transparent substrate.

9. The solar cell device as claimed in claim 8, wherein the infrared filter layer comprises lithium and fluorine-co-doped tin oxides or fluorine and aluminum-co-doped zinc oxides.

10. The solar cell device as claimed in claim 8, wherein the infrared filter layer comprises lithium and fluorine-co-doped tin oxides, and the lithium and fluorine-co-doped tin oxides in the infrared filter layer have a lithium doping concentration of about 1.5-3.5 at % and a fluorine doping concentration of about 0.6-3.5 at %.

11. The solar cell device as claimed in claim 1, further comprising an infrared filter layer and an anti-reflection layer sequentially disposed over a surface of the transparent substrate opposite to the transparent conductive layer, wherein the anti-reflection layer has a refractive index of about 1.2-1.45.

12. The solar cell device as claimed in claim 11, wherein the infrared filter layer comprises lithium, gallium, fluorine or antimony doped tin oxides.

13. The solar cell device as claimed in claim 11, wherein the anti-reflection layer comprises silicon dioxides or magnesium fluoride.

14. The solar cell device as claimed in claim 11, wherein the infrared filter layer has a thickness of about 100-600 nm.

15. The solar cell device as claimed in claim 11, wherein the anti-reflection layer has a thickness of about 100-180 nm.

16. The solar cell device as claimed in claim 11, wherein the infrared filter layer comprises fluorine doped tin oxide, and the fluorine doped tin oxide is further doped with lithium atoms.

* * * * *